(12) United States Patent
Tseng et al.

(10) Patent No.: US 11,690,173 B2
(45) Date of Patent: Jun. 27, 2023

(54) CIRCUIT BOARD STRUCTURE

(71) Applicant: Unimicron Technology Corp., Taoyuan (TW)

(72) Inventors: Tzyy-Jang Tseng, Taoyuan (TW); Chin-Sheng Wang, Taoyuan (TW); Ra-Min Tain, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/674,837

(22) Filed: Feb. 18, 2022

(65) Prior Publication Data

US 2022/0408554 A1    Dec. 22, 2022

Related U.S. Application Data

(60) Provisional application No. 63/213,667, filed on Jun. 22, 2021.

(30) Foreign Application Priority Data

Dec. 27, 2021 (TW) ................................ 110148855

(51) Int. Cl.
*H05K 1/18* (2006.01)
*H05K 1/02* (2006.01)
(Continued)

(52) U.S. Cl.
CPC .......... *H05K 1/0298* (2013.01); *H05K 1/023* (2013.01); *H05K 1/181* (2013.01); *H05K 1/185* (2013.01);
(Continued)

(58) Field of Classification Search
CPC ...... H05K 1/0298; H05K 1/023; H05K 1/181; H05K 1/185; H05K 1/032; H05K 1/036;
(Continued)

(56) References Cited

U.S. PATENT DOCUMENTS 7,554,131 B2    6/2009  Zeng
8,436,463 B2    5/2013  Hsu
(Continued)

FOREIGN PATENT DOCUMENTS

CN    209627793    11/2019
TW    201815240    4/2018

OTHER PUBLICATIONS

English Translation CN107919334, Zhang et al., Apr. 17, 2018 (Year: 2018).*

(Continued)

*Primary Examiner* — Steven T Sawyer
(74) *Attorney, Agent, or Firm* — JCIPRNET

(57) ABSTRACT

A circuit board structure includes a dielectric substrate, at least one embedded block, at least one electronic component, at least one first build-up circuit layer, and at least one second build-up circuit layer. The dielectric substrate includes a through cavity penetrating the dielectric substrate. The embedded block is fixed in the through cavity. The embedded block includes a first through hole and a second through hole. The electronic component is disposed in the through hole of the embedded block. The first build-up circuit layer is disposed on the top surface of the dielectric substrate and covers the embedded block. The second build-up circuit layer is disposed on the bottom surface of the dielectric substrate and covers the embedded block.

8 Claims, 2 Drawing Sheets

(51) Int. Cl.
  *H05K 1/09* (2006.01)
  *H05K 1/03* (2006.01)
  *H05K 1/11* (2006.01)

(52) U.S. Cl.
  CPC .............. *H05K 1/032* (2013.01); *H05K 1/036* (2013.01); *H05K 1/092* (2013.01); *H05K 1/113* (2013.01); *H05K 2201/0323* (2013.01)

(58) Field of Classification Search
  CPC .................. H05K 1/092; H05K 1/113; H05K 2201/0323; H05K 1/182; H05K 1/183; H05K 1/184; H01L 23/5389; H01L 24/00
  See application file for complete search history.

(56) References Cited

U.S. PATENT DOCUMENTS

| | | | |
|---|---|---|---|
| 8,455,994 B2 | 6/2013 | Iihola et al. | |
| 2002/0020898 A1* | 2/2002 | Vu | H01L 24/82 257/676 |
| 2005/0161823 A1* | 7/2005 | Jobetto | H01L 24/05 257/E23.178 |
| 2014/0133117 A1* | 5/2014 | Saji | H01L 24/19 361/761 |
| 2017/0256497 A1* | 9/2017 | Mano | H05K 1/115 |
| 2018/0352658 A1* | 12/2018 | Yang | H01L 24/25 |
| 2020/0015357 A1* | 1/2020 | Kim | H01Q 1/22 |
| 2021/0298178 A1* | 9/2021 | Kawai | H05K 1/185 |

OTHER PUBLICATIONS

"Office Action of Taiwan Counterpart Application", dated Oct. 11, 2022, pp. 1-9.

* cited by examiner

CIRCUIT BOARD STRUCTURE

CROSS-REFERENCE TO RELATED APPLICATION

This application claims the priority benefit of U.S. provisional application Ser. No. 63/213,667, filed on Jun. 22, 2021, and Taiwan application serial no. 110148855, filed on Dec. 27, 2021. The entirety of each of the above-mentioned patent applications is hereby incorporated by reference herein.

BACKGROUND

Technology Field

The disclosure relates to a circuit board structure, and particularly, to a circuit board structure with embedded blocks.

Description of Related Art

Currently, circuit boards embedded with electronic components are generally unable to effectively remove the heat generated by the electronic components, which leads to the problem of poor heat dissipation. Although switching the core layer of the circuit board to a metal material may improve the problem of poor heat dissipation, there may be difficulty in assembly resulting from the too good heat dissipation effect of the core layer. For example, non-embedded electronic components or chip package structures can usually be bonded to a circuit board through solder balls, but the core layer of the circuit board is made of metal material, so it not easy for the solder to adhere to the circuit board due to the good heat dissipation effect of the circuit board. Therefore, solder balls cannot be formed, and thus the non-embedded electronic components or the chip package structures cannot be smoothly bonded to the circuit board.

SUMMARY

The disclosure provides a circuit board structure capable of improving the heat dissipation effect, shortening the signal transmission distance, reducing the overall size, or reducing the signal loss.

The circuit board structure of the disclosure includes a dielectric substrate, at least one embedded block, at least one electronic component, at least one first build-up circuit layer, and at least one second build-up circuit layer. The dielectric substrate has a top surface and a bottom surface opposite to the top surface and includes at least one through cavity. The through cavity penetrates the dielectric substrate. The embedded block is fixed in the through cavity. The embedded block has a top surface and a bottom surface opposite to the top surface and includes at least one first through hole. The electronic component is disposed in the first through hole of the embedded block. The first build-up circuit layer is disposed on the top surface of the dielectric substrate and covers the embedded block. The second build-up circuit layer is disposed on the bottom surface of the dielectric substrate and covers the embedded block.

In an embodiment of the disclosure, the embedded block further includes at least one second through hole, and the circuit board structure further includes at least one conductive through via. The conductive through via is disposed in the second through hole of the embedded block and electrically connected to the first build-up circuit layer and the second build-up circuit layer.

In an embodiment of the disclosure, the embedded block includes conductive materials, the conductive materials include a metal, an alloy, or a metal mixed with a non-metallic material, and the non-metallic material includes diamond or graphene.

In an embodiment of the disclosure, the embedded block includes a non-conductive material, and the non-conductive material includes glass, ceramic, or other organic materials.

In an embodiment of the disclosure, the circuit board structure further includes a connection layer. The connection layer is disposed between the first build-up circuit layer and the second build-up circuit layer and electrically connected to the first build-up circuit layer and the second build-up circuit layer.

In an embodiment of the disclosure, the connection layer is electrically connected to the first build-up circuit layer and the electronic component.

In an embodiment of the disclosure, the electronic component is a passive component.

In an embodiment of the disclosure, the electronic component is an active component.

In an embodiment of the disclosure, the active component is a bare die or a packaged module.

In an embodiment of the disclosure, the circuit board structure further includes a dielectric material. The dielectric material is disposed in a gap between the electronic component and the embedded block and further includes a prepreg or a gel.

In an embodiment of the disclosure, the dielectric material is disposed in a gap between the electronic component and the second build-up circuit layer.

In summary, in the circuit board structure of an embodiment of the disclosure, with the configuration of the electronic components in the first through hole of the embedded block (i.e., the electronic components are embedded in the dielectric substrate), the overall size may be reduced, and the signal transmission distance between the embedded electronic components and other electronic components outside the dielectric substrate may be shortened.

In order to make the features and advantages of the disclosure comprehensible, embodiments accompanied with drawings are described in detail below.

DESCRIPTION OF THE EMBODIMENTS

Figure 1:
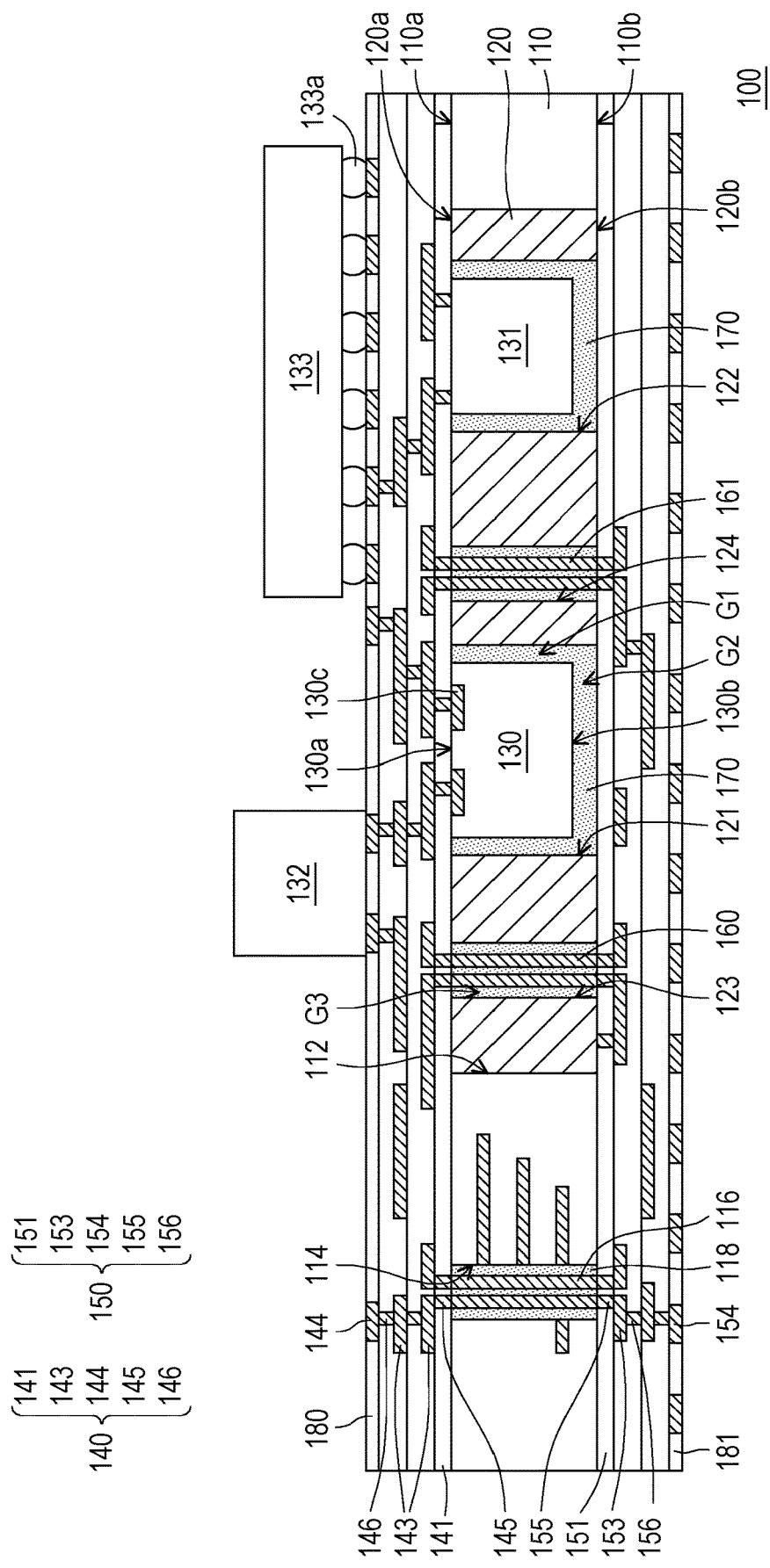
FIG. 1 is a schematic cross-sectional view of a circuit board structure according to an embodiment of the disclosure.

FIG. 1 is a schematic cross-sectional view of a circuit board structure according to an embodiment of the disclosure. Referring to FIG. 1, a circuit board structure 100 of the embodiment includes a dielectric substrate 110, at least one embedded block 120, at least one electronic component 130, at least one electronic component 131, at least one first build-up circuit layer 140, at least one second build-up circuit layer 150, at least one conductive through via 160, at least one conductive through via 161, and a dielectric material 170. The dielectric substrate 110 has a top surface 110a and a bottom surface 110b opposite to the top surface 110a. The dielectric substrate 110 includes at least one through cavity 112, a through hole 114, a conductive through via 116, and a dielectric material layer 118.

Specifically, the through cavity 112 and the through hole 114 each penetrate the dielectric substrate 110. The through cavity 112 and the through hole 114 may communicate with the top surface 110a and the bottom surface 110b of the dielectric substrate 110. The conductive through via 116 may be disposed in the through hole 114. The dielectric material layer 118 may be disposed in the through hole 114 and may be disposed in the gap between the conductive through via 116 and the dielectric substrate 110. In the embodiment, the material of the dielectric substrate 110 may include epoxy glass cloth laminate (FR-4) or bismaleimide triazine resin, but it is not limited thereto.

The embedded block 120 is fixed in the through cavity 112. The embedded block 120 has a top surface 120a and a bottom surface 120b opposite to the top surface 120a. The top surface 120a of the embedded block 120 may be substantially flush with the top surface 110a of the dielectric substrate 110, and the bottom surface 120b of the embedded block 120 may be substantially flush with the bottom surface 110b of the dielectric substrate 110. The embedded block 120 includes at least one first through hole 121, at least one first through hole 122, at least one second through hole 123, and at least one second through hole 124. The first through holes 121 and 122 may penetrate the embedded block 120 and communicate with the top surface 120a and the bottom surface 120b of the embedded block 120. The second through holes 123 and 124 may penetrate the embedded block 120 and communicate with the top surface 120a and the bottom surface 120b of the embedded block 120.

In the embodiment, the embedded block 120 may include conductive materials, so the heat generated by the electronic components 130 and 131 may be transmitted through the embedded block 120, thereby improving the overall heat dissipation effect. The conductive materials may include a metal (e.g., copper), an alloy, or a metal mixed with non-metallic materials. The non-metallic materials may include diamond or graphene, but it is not limited thereto. In some embodiments, the embedded block 120 may include non-conductive materials. The non-conductive materials may include glass, ceramics, or other organic materials, but it is not limited thereto.

The electronic components 130 and 131 are disposed in the first through holes 121 and 122 of the embedded block 120. There is a gap G1 between the electronic components 130 and 131 and the embedded block 120, and there is a gap G2 between the electronic components 130 and 131 and the second build-up circuit layer 150. The electronic components 130 and 131 may be active components and/or passive components. The active component may be a bare die or a packaged module, and the passive component may be a capacitor, an inductor, or a resistor, but it is not limited thereto. For example, in the embodiment, the electronic component 130 is an active component disposed in the first through hole 121, for example, and the electronic component 131 is a passive component disposed in the first through hole 122, for example. The electronic component 130 has an active surface 130a, a back surface 130b opposite to the active surface 130a, and a pad 130c disposed on the active surface 130a. The active surface 130a may be substantially flush with the top surface 120a of the embedded block 120.

In the embodiment, by embedding the electronic components 130 and 131 in the dielectric substrate 110, not only the module density of the circuit board structure 100 can be increased, but also the overall size (e.g., the volume and the area) of the circuit board structure 100 can be reduced. In addition, compared to multiple electronic components that are disposed in a horizontal manner and transmit signals in a horizontal manner, the embedded electronic components 130 and 131 can transmit signals in a vertical manner with the non-embedded electronic components 132 and 133 to shorten the signal transmission distance and improve the electrical effect.

The first build-up circuit layer 140 is disposed on the top surface 110a of the dielectric substrate 110 and covers the dielectric substrate 110 and the embedded block 120. The first build-up circuit layer 140 may include at least one first dielectric layer 141, at least one first circuit layer 143, a first circuit layer 144, at least one first conductive via 145, and at least one first conductive via 146. The first dielectric layer 141 and the first circuit layer 143 are sequentially stacked on the top surface 110a of the dielectric substrate 110 and the embedded block 120. The first circuit layer 144 is disposed on the first dielectric layer 141 away from the dielectric substrate 110 to be exposed outside the first dielectric layer 141. The first conductive via 145 and the first conductive via 146 each penetrate the first dielectric layer 141. The first conductive via 145 may be electrically connected to the first circuit layer 143 and the conductive through via 116, the first conductive via 145 may be electrically connected to the first circuit layer 143 and the conductive through via holes 160 and 161, and the first conductive via 145 may also be electrically connected to the first circuit layer 143 and the electronic components 130 and 131. The first conductive via 146 may be electrically connected to two adjacent first circuit layers 143 and may also be electrically connected to the first circuit layer 144 and the first circuit layer 143. In the embodiment, the circuits (including the first circuit layers 143 and 144) in the first build-up circuit layer 140 may be thin circuits.

In the embodiment, three first dielectric layers 141 in the first build-up circuit layer 140 are illustrated as an example, and two first circuit layers 143 and one first circuit layers 144 are illustrated as an example, but the disclosure does not limit the quantity of the first dielectric layer 141 and the quantity of the first circuit layers 143 and 144. That is, in some embodiments, the first dielectric layer 141 may also have 1-2 layers or 3 or more layers, and the first circuit layers 143 and 144 may also have 2 layers or 3 or more layers.

The second build-up circuit layer 150 is disposed on the bottom surface 110b of the dielectric substrate 110 and covers the dielectric substrate 110 and the embedded block 120. The second build-up circuit layer 150 may include at least one second dielectric layer 151, at least one second circuit layer 153, a second circuit layer 154, at least one second conductive via 155, and at least one second conductive via 156. The second dielectric layer 151 and the second circuit layer 153 are sequentially stacked on the bottom surface 110b of the dielectric substrate 110 and the embedded block 120. The second circuit layer 154 is disposed on the second dielectric layer 151 away from the dielectric substrate 110 to be exposed outside the second dielectric layer 151. The second conductive via 155 and the second conductive via 156 each penetrate the second dielectric layer 151. The second conductive via 155 may be electrically connected to the second circuit layer 153 and the conductive through via 116, and the second conductive via 155 may be electrically connected to the second circuit layer 153 and the conductive through vias 160 and 161. The second conductive via 156 may be electrically connected to two adjacent second circuit layers 153 and may also be electrically connected to the second circuit layer 154 and the second circuit layer 153. In the embodiment, the circuits (including the second circuit layers 153 and 154) in the second build-up circuit layer 150 may be thin circuits.

In the embodiment, three second dielectric layers 151 in the second build-up circuit layer 150 are illustrated as an example, and two second circuit layers 153 and one second circuit layers 154 are illustrated as an example, but the disclosure does not limit the quantity of the second dielectric layer 151 and the quantity of the second circuit layers 153 and 154. That is, in some embodiments, the second dielectric layer 151 may also have 1-2 layers or 3 or more layers, and the second circuit layers 153 and 154 may also have 1-2 layers or 3 or more layers.

The conductive through via 160 and the conductive through via 161 each may be disposed in the second through hole 123 and the second through hole 124 of the embedded block 120, and there is a gap G3 between the conductive through vias 160 and 161 and the embedded block 120. The conductive through vias 160 and 161 may be in contact with the first conductive via 145 and the second conductive via 155 so that the conductive through vias 160 and 161 may be electrically connected to the first build-up circuit layer 140 and the second build-up circuit layer 150. In the embodiment, the conductive through vias 160 and 161 may be surrounded by the embedded block 120 including conductive materials, so the signals of the conductive through vias 160 and 161 can be protected from noise interference, thereby reducing signal loss and allowing the signals to have favorable integrity.

The dielectric material 170 may be disposed in the gap G1 between the electronic components 130 and 131 and the embedded block 120, and the dielectric material 170 may be disposed in the gap G2 between the electronic components 130 and 131 and the second build-up circuit layer 150. In the embodiment, the dielectric material 170 may also be disposed in the gap G3 between the conductive through vias 160 and 161 and the embedded block 120 to prevent short circuits between the conductive through vias 160 and 161 and the embedded block 120 including the conductive materials. The dielectric material may include a prepreg, a resin, or a gel, but it is not limited thereto.

In addition, in the embodiment, the circuit board structure 100 may further include a solder mask layer 180, a solder mask layer 181, the electronic component 132, and the electronic component 133. The solder mask 180 is disposed on the first build-up circuit layer 140, covers the first dielectric layer 141, and exposes the first circuit layer 144. The solder mask 181 is disposed on the second build-up circuit layer 150, covers the second dielectric layer 151, and exposes the second circuit layer 154. The electronic component 132 and the electronic component 133 each may be disposed on the first build-up circuit layer 140. The electronic component 132 may be in contact with the first circuit layer 144 exposed by the solder mask layer 180. The electronic component 133 may be electrically connected to the first circuit layer 144 exposed by the solder mask layer 180 through a conductive terminal 133a.

Other embodiments are provided below for explanation. It should be noted here that the following embodiments adopt the reference numbers and partial contents of the foregoing embodiments, wherein the same reference numbers are used to indicate the same or similar elements, and the description of the same technical content is omitted. For the description of the omitted parts, reference may be made to the foregoing embodiments, and the same content will not be iterated in the following embodiments.

Figure 2:
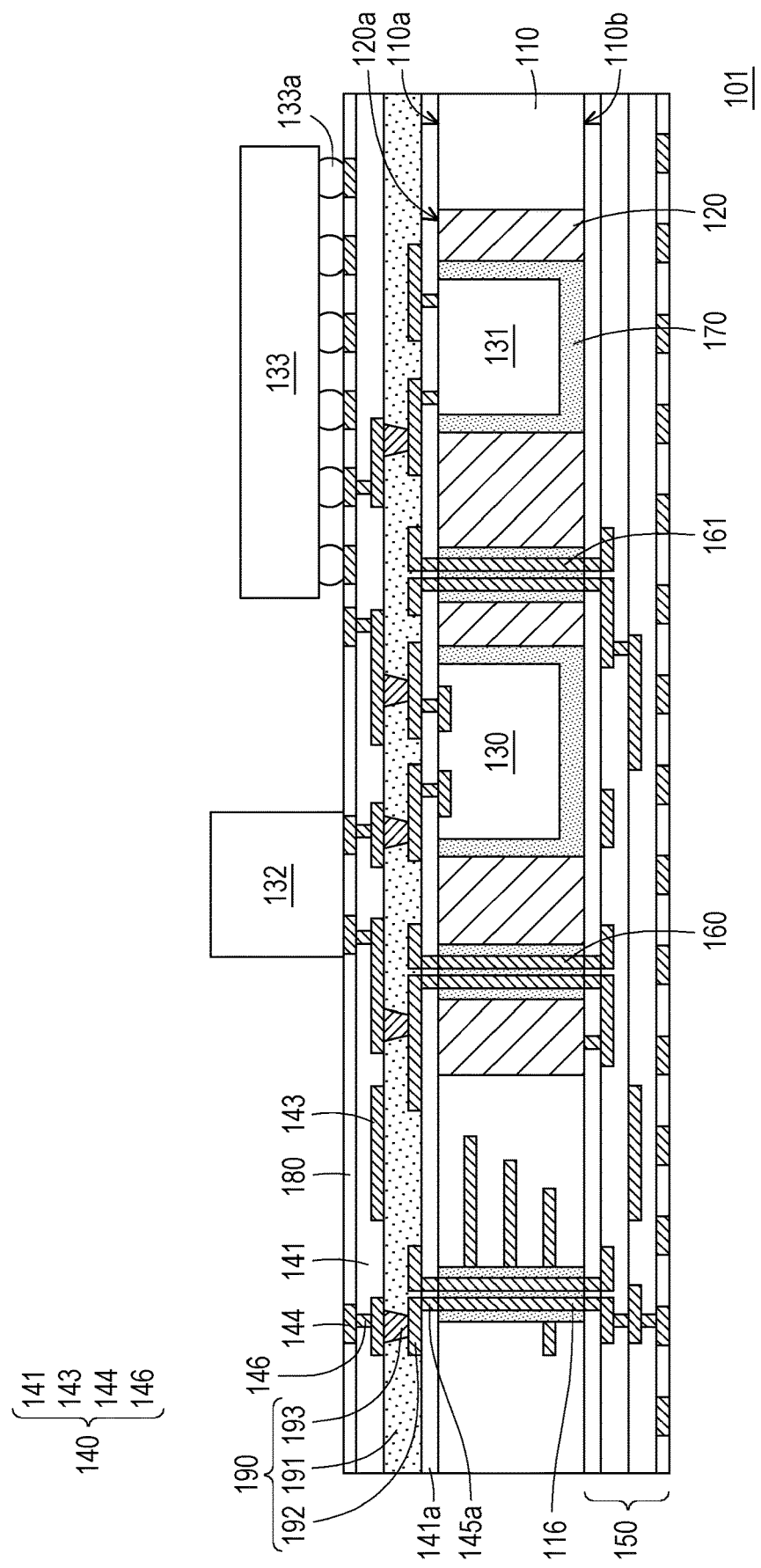
FIG. 2 is a schematic cross-sectional view of a circuit board structure according to another embodiment of the disclosure.

FIG. 2 is a schematic cross-sectional view of a circuit board structure according to another embodiment of the disclosure. Referring to both FIG. 1 and FIG. 2, a circuit board structure 101 of the embodiment is similar to the circuit board structure 100 in FIG. 1, but the main difference between the two is that the circuit board structure 101 of the embodiment further includes a connection layer 190, a dielectric layer 141a, and a conductive via 145a.

Specifically, referring to FIG. 2, in the embodiment, the dielectric layer 141a is disposed on the top surface 110a of the dielectric substrate 110 and covers the dielectric substrate 110 and the embedded block 120. The conductive via 145a penetrates the dielectric layer 141a to be electrically connected to the conductive through via 116, the conductive through via 160 and 161, and the electronic components 130 and 131, respectively.

The connection layer 190 is disposed on the dielectric layer 141a and between the first build-up circuit layer 140 and the dielectric layer 141a. The connection layer 190 is disposed between the first build-up circuit layer 140 and the second build-up circuit layer 150. The connection layer 190 includes a third dielectric layer 191, a third circuit layer 192, and a third conductive via 193. The third circuit layer 192 is disposed on the dielectric layer 141a and in contact with the conductive via 145a. The third dielectric layer 191 is disposed on the third circuit layer 192 and covers the third circuit layer 192 and the dielectric layer 141a. The third conductive via 193 penetrates the third dielectric layer 191 and is electrically connected to the first circuit layer 143 and the third circuit layer 192 of the first build-up circuit layer 140. In addition, in the embodiment, the material of the third dielectric layer 191 may include polypropylene, and the material of the third conductive via 193 may include copper paste, but it is not limited thereto.

In the embodiment, the first build-up circuit layer 140 may be electrically connected to the electronic components 130 and 131 through the connection layer 190 and the conductive via 145a. The first build-up circuit layer 140 may be electrically connected to the second build-up circuit layer 150 through the connection layer 190, the conductive via 145a, and the conductive through via 116 (or the conductive through vias 160 and 161).

In the embodiment, one first dielectric layer 141 in the first build-up circuit layer 140 is illustrated as an example, and one first circuit layers 143 and one first circuit layers 144 are illustrated as an example, but the disclosure does not limit the quantity of the first dielectric layer 141 and the quantity of the first circuit layers 143 and 144. That is, in some embodiments, the first dielectric layer 141 may also have one or more layers, and the first circuit layers 143 and 144 may also have two or more layers.

In the embodiment, the configuration of the connection layer 190 allows the first build-up circuit layer 140 to be fabricated not on the dielectric substrate 110 or the connection layer 190 depending on the situation. Instead, the first build-up circuit layer 140 may be pre-fabricated and directly integrated on the connection layer 190, thereby preventing poor yield problems, such as the inaccuracy of alignment of different layers of the first dielectric layer 141, the first circuit layers 143 and 144, and the first conductive vias 145 and 146 fabricated on the dielectric substrate 110 or the connection layer 190. The yield rate of the pre-fabricated first build-up circuit layer 140 is checked before the prefabricated first build-up circuit layer 140 is disposed on the connection layer 190.

In the embodiment, although the connection layer 190 is disposed between the first build-up circuit layer 140 and the dielectric substrate 110, the disclosure does not limit the configuration position of the connection layer. That is, in some embodiments, the connection layer (not shown) may also be disposed between the second build-up circuit layer 150 and the dielectric substrate 110.

In some embodiments, the connection layer 190 may be further electrically connected to the embedded block 120 for the purpose of grounding, but it is not limited thereto.

In summary, in the circuit board structure of an embodiment of the disclosure, with the configuration of the electronic components in the first through hole of the embedded block (i.e., the electronic components are embedded in the dielectric substrate), the overall size may be reduced, and the signal transmission distance between the embedded electronic components and other electronic components outside the dielectric substrate may be shortened. In addition, if the embedded block may include conductive materials, the heat generated by the embedded electronic components may be transferred through the embedded block, thereby improving the overall heat dissipation effect. Moreover, with the configuration of the conductive through vias in the second through holes of the embedded block, the periphery of the conductive through vias may be surrounded by the embedded block including the conductive materials, so the signals of the conductive through vias are protected from noise interference, thereby reducing the signal loss and allowing the signals to have favorable integrity.

Although the disclosure has been described with reference to the above embodiments, they are not intended to limit the disclosure. It will be apparent to one of ordinary skill in the art that modifications and changes to the described embodiments may be made without departing from the spirit and the scope of the disclosure. Accordingly, the scope of the disclosure will be defined by the attached claims and their equivalents and not by the above detailed descriptions.

What is claimed is:

1. A circuit board structure, comprising: a dielectric substrate comprising a top surface and a bottom surface opposite to the top surface and comprising at least one through cavity penetrating the dielectric substrate; at least one embedded block fixed in the at least one through cavity, comprising a top surface and a bottom surface opposite to the top surface, and comprising at least one first through hole and at least one second through hole; at least one electronic component disposed in the at least one first through hole of the at least one embedded block; at least one first build-up circuit layer disposed on the top surface of the dielectric substrate and covering the at least one embedded block; at least one second build-up circuit layer disposed on the bottom surface of the dielectric substrate and covering the at least one embedded block; and at least one conductive through via disposed in the second through hole of the at least one embedded block, wherein the at least one conductive through via contacts and is directly electrically connected to the at least one first build-up circuit layer and the at least one second build-up circuit layer; wherein the at least one embedded block comprises conductive materials, the conductive materials comprise a metal, an alloy, or a metal mixed with a non-metallic material, and the non-metallic material comprises diamond or graphene.

2. The circuit board structure according to claim 1, further comprising:
a connection layer disposed between the at least one first build-up circuit layer and the at least one second build-up circuit layer and electrically connected to the at least one first build-up circuit layer and the at least one second build-up circuit layer.

3. The circuit board structure according to claim 2, wherein the connection layer is electrically connected to the at least one first build-up circuit layer and the at least one electronic component.

4. The circuit board structure according to claim 1, wherein the at least one electronic component is a passive component.

5. The circuit board structure according to claim 1, wherein the at least one electronic component is an active component.

6. The circuit board structure according to claim 5, wherein the active component is a bare die or a packaged module.

7. The circuit board structure according to claim 1, further comprising:
a dielectric material disposed in a gap between the at least one electronic component and the at least one embedded block and comprising a prepreg, a resin, or a gel.

8. The circuit board structure according to claim 7, wherein the dielectric material is disposed in a gap between the at least one electronic component and the at least one second build-up circuit layer.

* * * * *